US006436807B1

(12) United States Patent
Cwynar et al.

(10) Patent No.: US 6,436,807 B1
(45) Date of Patent: Aug. 20, 2002

(54) METHOD FOR MAKING AN INTERCONNECT LAYER AND A SEMICONDUCTOR DEVICE INCLUDING THE SAME

(75) Inventors: Donald Thomas Cwynar; Sudhanshu Misra, both of Orlando, FL (US); Dennis Okumu Ouma, Somerset, NJ (US); Vivek Saxena, Orlando, FL (US); John Michael Sharpe, Allentown, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/484,310

(22) Filed: Jan. 18, 2000

(51) Int. Cl.$^7$ ........................................... H01L 21/4763
(52) U.S. Cl. ........................ 438/619; 438/618; 438/620; 438/756; 438/926; 437/225
(58) Field of Search ................................. 438/926, 756, 438/619, 620, 621, 622, 624, 631; 437/225

(56) References Cited

U.S. PATENT DOCUMENTS

| 5,494,853 A | * | 2/1996 | Lur ............................. 437/195 |
| 5,508,233 A | * | 4/1996 | Yost et al. .................... 437/228 |
| 5,597,668 A | | 1/1997 | Nowak et al. ................... 430/5 |
| 5,639,697 A | * | 6/1997 | Weling et al. ............... 437/225 |
| 5,733,798 A | * | 3/1998 | Michael et al. ............. 437/195 |
| 5,763,955 A | * | 6/1998 | Findley et al. .............. 257/775 |
| 5,866,482 A | * | 2/1999 | Lee ............................. 438/720 |
| 5,981,384 A | * | 11/1999 | Juengling .................... 438/666 |
| 6,069,067 A | * | 5/2000 | Kinugawa .................... 438/622 |
| 6,093,631 A | * | 7/2000 | Jaso et al. .................... 438/618 |
| 6,200,897 B1 | * | 3/2001 | Wang et al. ................. 438/692 |

FOREIGN PATENT DOCUMENTS

| JP | 9293840 A | * | 11/1997 | ....... H01L/21/3205 |
| JP | 10178011 A | * | 6/1998 | ....... H01L/21/3205 |
| WO | 01/43194 | | 6/2001 | ........... H01L/27/02 |

OTHER PUBLICATIONS

Stine et al., *The Physical and Electrical Effects of Metal–Fill Patterning Practices for Oxide Chemical–Mechanical Polishing Processes*, Transactions on Electron Devices, vol. 45, No. 3, Mar. 1998.

Kahng et al., *Filling Algorithms and Analyses for Layout Density Control*, Transactions on Computer–Aided Design of Integrated Circuits and Systems, vol. 18, No. 4, Apr. 1999.

Kahng et al., *New Multilevel and Hierarchical Algorithms for Layout Density Control*, Design Automation Conference, 1999, Proceedings of the ASP–DAC '99. A Pacific, 1999, pp. 221–224, vol. 1.

Kahng et al., *New and Exact Filling Algorithms for Layout Density Control*, VLSI Design, 1999, Proceedings, Twelfth International Conference, 1999, pp. 106–110.

* cited by examiner

Primary Examiner—Matthew Smith
Assistant Examiner—Renzo N. Rocchegiani

(57) ABSTRACT

A method for making a layout for an interconnect layer of a semiconductor device to facilitate uniformity of planarization during manufacture of the semiconductor device includes determining an active interconnect feature density for each of a plurality of layout regions of the interconnect layout. The method further includes adding dummy fill features to each layout region to obtain a desire density of active interconnect features and dummy fill features to facilitate uniformity of planarization during manufacturing of the semiconductor device. By adding dummy fill features to obtain a desired density of active interconnect features and dummy fill features, dummy fill features are not unnecessarily added, and each layout region has a uniform density.

18 Claims, 3 Drawing Sheets

METHOD FOR MAKING AN INTERCONNECT LAYER AND A SEMICONDUCTOR DEVICE INCLUDING THE SAME

FIELD OF THE INVENTION

The present invention relates to the field of integrated circuit manufacturing, and, more particularly, to dummy fill features in an interconnect layer.

BACKGROUND OF THE INVENTION

Chemical-mechanical polishing (CMP) is a technique for planarizing an interconnect layer overlying a semiconductor substrate. Typically, multiple interconnect layers are stacked over the semiconductor substrate, wherein each interconnect layer includes active interconnect features connecting active areas of the semiconductor substrate. An active area is that portion of the semiconductor substrate in which components are built, such as transistors, capacitors and resistors.

It is desirable to have a flat or planarized upper surface of each interconnect layer prior to forming subsequent interconnect layers. Depending on the density of the area occupied by the active interconnect features, the upper surface may not always be flat after deposition of a dielectric material, thus the need for CMP.

The active interconnect features in an interconnect layer are separated by trenches. Referring to FIG. 1., the trenches 10 and 12 between active interconnect features 20, 22 and 24 are much narrower than the trench 14 between active interconnect features 24 and 26. One approach for filling the trenches 10, 12 and 14 with dielectric material, particularly when the trenches are between closely spaced active interconnect features, is by a high density plasma chemical vapor deposition (HDP-CVD) process. If the deposited dielectric material 34 has a sufficient thickness, then the single step deposition process allows the interconnect layer 30 to be planarized.

As a result of the HDP-CVD process, there are protrusions 32 in the upper surface of the dielectric material 34 above respective active interconnect features 20–26. Each protrusion 32 has associated therewith a bias This bias can be defined as either positive or negative. For the HDP-CVD process as illustrated in FIG. 1, each protrusion 32 has a negative bias, i.e., the width of the protrusion is less than the width or lateral dimension 90 of the underlying active interconnect feature. Where there are no active interconnect features, such as between active interconnect features 24 and 26, the upper surface of the dielectric material 34 is relatively flat.

Another approach for depositing the dielectric material is by a two-step process, as shown in FIG. 2. The first step is the HDP-CVD process for filling in the trenches 10–14 with the dielectric material 34 between the active interconnect features 20–26. Once the trenches 10–14 are filled, a plasma enhanced chemical vapor deposition (PE-CVD) process adds additional dielectric material 35 allowing a combined thickness sufficient for planarization. The protrusions 42 formed above the respective active interconnect features 20–26 after the PE-CVD process results in a positive bias. Positive bias is where the width of the protrusion 42 is greater than the width or lateral dimension 90 of the underlying active interconnect feature.

Depending on the deposition process, CMP is used to eliminate the protrusions 42 having positive bias and the protrusions 32 having a negative bias. However, if pattern density variations of the active interconnect features 20–26 are large, CMP is not adequate to sufficiently planarize the interconnect layer 30. For example, planarization of the relatively flat dielectric material overlying active interconnect features 24 and 26 results in over polishing. This causes significant dishing in the dielectric material 34 or 35, which results in a non-planarized surface. A non-planarized surface of the interconnect layer 30 may cause reliability problems with an overlying interconnect layer.

One approach for preventing over polishing is to place dummy fill features in the open regions adjacent active interconnect features for preventing pattern density variations of the active interconnect features. Placement of the dummy fill features is typically done using a layout algorithm as part of a layout editor or an automated pattern generator.

Conventional layout algorithms for placing dummy fill features in open areas of the interconnect layer are performed based upon a predetermined set density. Each open area to be filled with dummy fill features will have the same density. In other words, the dummy fill feature density is independent of the density of the adjacent active interconnect features. An open area is defined as any area within the interconnect layer that does not have metal therein. The fill feature density is defined as the ratio of the area occupied by the metal to the total area.

However, if the density of an active interconnect feature is high with respect to an adjacent open area, it is not always necessary to place dummy fill features in the corresponding open area at the same predetermined set density. Unnecessarily placing dummy fill features adds to the parasitic capacitance of the interconnect layer. Moreover, there is no constant overall fill density between open areas of the interconnect layer. This variation in the density of the interconnect layer also causes deviations when the interconnect layer is planarized. Therefore, there is a need for making a layout for an interconnect layer that determines placement of dummy fill features for achieving a uniform density throughout the interconnect layer.

SUMMARY OF THE INVENTION

An object of the present invention is to provide a method for making a layout for an interconnect layer that has uniform density throughout to facilitate planarization during manufacturing of a semiconductor device.

Another object of the present invention is to position dummy fill features within the interconnect layer to minimize parasitic capacitance with adjacent interconnect features.

These and other objects, advantages and features in accordance with the present invention are provided by a method for making a layout for an interconnect layer of a semiconductor device to facilitate uniformity of planarization during manufacture of the semiconductor device, wherein the method comprises the steps of determining an active interconnect feature density for each of a plurality of layout regions of the interconnect layout, and adding dummy fill features to each layout region to obtain a desired density of active interconnect features and dummy fill features to facilitate uniformity of planarization during manufacturing of the semiconductor device.

An important feature of the present invention is that each layout region preferably has a uniform density. By adding dummy fill features to obtain a desired density of active interconnect features and dummy fill features, dummy fill features are not unnecessarily added. Unnecessarily adding dummy fill features would undesirably increase the parasitic capacitance of the interconnect layer.

When each layout region has a uniform density, the dummy fill features thus facilitate uniformity of planarization during manufacturing of the semiconductor device. Another important feature of the present invention is that positioning of the dummy fill features is preferably based upon capacitance with adjacent active interconnect features. Likewise, the dummy fill features are also preferably positioned based upon capacitance with adjacent active interconnect features in an adjacent interconnect layer.

Yet another important feature of the method of the present invention preferably includes defining a minimum dummy fill feature lateral dimension based upon a dielectric layer deposition bias for a dielectric layer to be deposited over the interconnect layer. After a single step HDP-CVD process, the protrusion in the dielectric material overlying a respective active interconnect feature has a negative bias. Negative bias is where the width of the protrusion is less than the width or lateral dimension of the underlying active interconnect feature. In one embodiment, the lateral dimension of the dummy fill feature is preferably at least twice as great as an absolute value of a negative dielectric layer deposition bias.

Another aspect of the present invention relates to a method for making a semiconductor device comprising the steps of making active regions in a semiconductor substrate, making a layout for an interconnect layer comprising the steps of determining an active interconnect feature density for each of a plurality of layout regions of the interconnect layout; and adding dummy fill features to each layout region to obtain a desired density of active interconnect features and dummy fill features to facilitate uniformity of planarization during manufacturing of the semiconductor device. The method preferably further comprises using the layout to make the interconnect layer overlying the semiconductor substrate.

Yet another aspect of the present invention is a semiconductor device comprising a semiconductor substrate, and at least one interconnect layer overlying the semiconductor substrate comprising a plurality of layout regions. Each layout region preferably comprises an active interconnect feature region and a dummy fill feature region adjacent thereto for facilitating uniformity of planarization during manufacturing of the semiconductor device.

Each of the dummy fill regions preferably has a different density with respect to other dummy fill regions so that a combined density of the active interconnect feature region and the dummy fill feature region for a respective layout region is substantially uniform with respect to a combined density of other layout regions. The interconnect layer preferably comprises metal, and each layout region preferably has a uniform density.

DETAILED DESCRIPTION OF THE DRAWINGS

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 3:
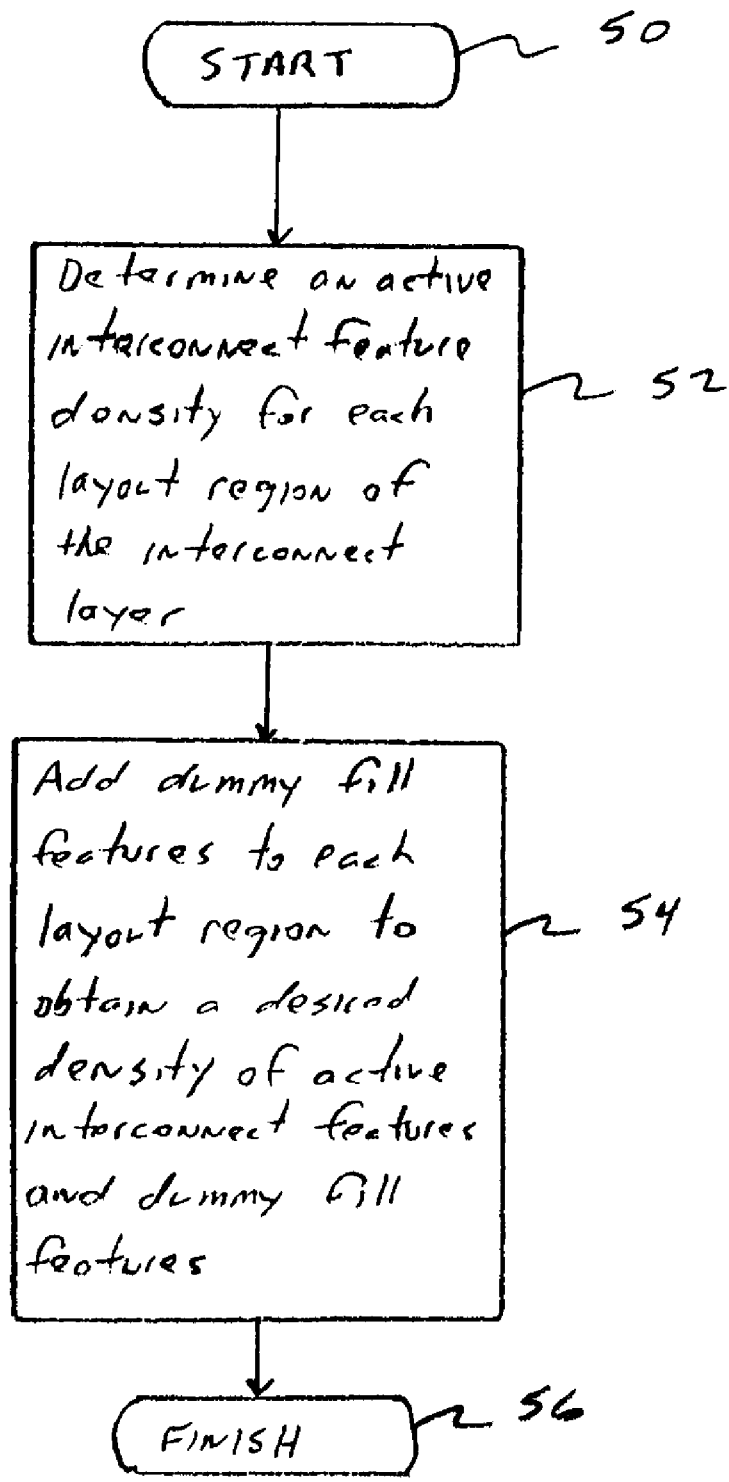
FIG. 3 is a flowchart illustrating the method for making a layout for an interconnect layer in accordance with the present invention.
Figure 4:
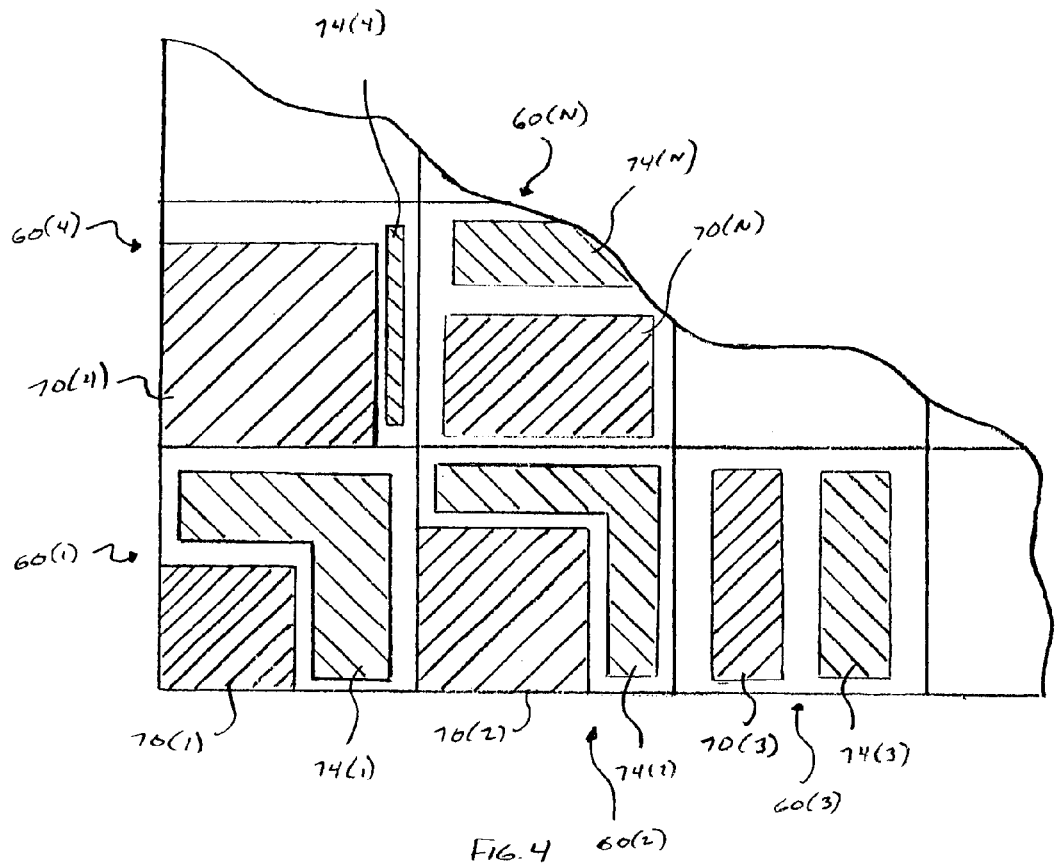
FIG. 4 is a partial top plan view of an interconnect layer divided into layout regions in accordance with the present invention.
Figure 5:
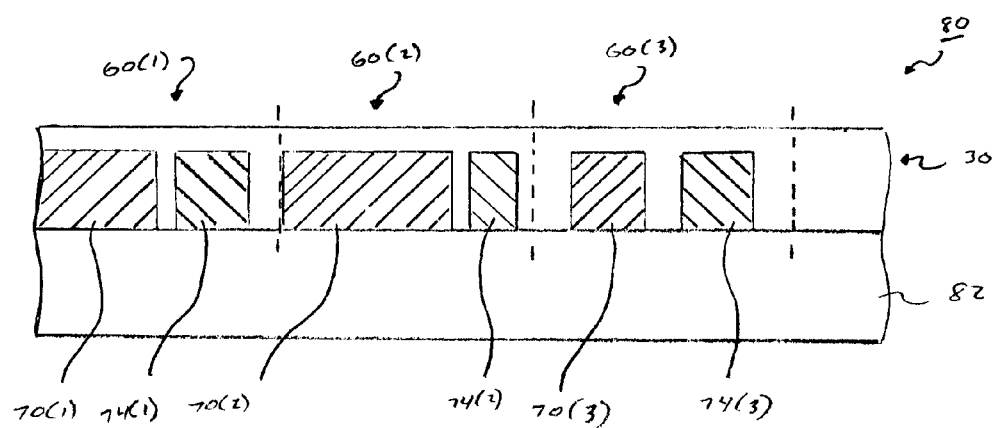
FIG. 5 is a partial cross-sectional view of a semiconductor device including the interconnect layer illustrated in FIG. 4.

A method for making a layout for an interconnect layer of a semiconductor device to facilitate uniformity of planarization during manufacture of the semiconductor device is described with reference to FIGS. 3–5. From the start (Block 50), the method comprises the step of determining an active interconnect feature density for each of a plurality of layout regions 60(1)–60(n) of the interconnect layout 30 at Block 52 and as shown in FIG. 4.

The dimensions of each layout region 60(1)–60(n) are preferably equal, and an illustrative size may be 100 micrometers by 100 micrometers. Moreover, the layout regions 60(1)–60(n) are contiguous. However, other dimensions are acceptable and the dimensions of each layout region do not have to be equal, as readily appreciated by one skilled in the art. For purposes of illustration, the active interconnect features 70(1)–70(n) are generally indicated by a single shaded area within each layout region 60(1)–60(n). Each shaded area comprises a plurality of metal lines or traces connecting the active areas in the semiconductor substrate 82, as readily appreciated by one skilled in the art.

The density of the active interconnect features 70(1)–70(n) for respective layout regions 60(1)–60(n) is determined using a layout algorithm. This layout algorithm may be the same layout algorithm used for preforming the steps illustrated in FIG. 3 for making the desired layout of the interconnect layer, as readily appreciated by one skilled in the art.

The method further comprises the step of adding dummy fill features 74(1)–74(n) to each respective layout region 60(1)–60(n) to obtain a desired density of active interconnect features and dummy fill features to facilitate uniformity of planarization during manufacturing of the semiconductor device 80 at Block 54. For purposes of illustration, the dummy fill features 74(1)–74(n) are generally indicated by a single shaded area within each layout region 60(1)–60(n). Each shaded area thus comprises dummy metal lines or traces, as readily appreciated by one skilled in the art. The method advantageously adds dummy fill features 74(1)–74(n) so that a uniform density is obtained for each layout region 60(1)–60(n). Making the interconnect layer 30 is completed at Block 56.

For example, if the density of the active interconnect features 70(1) in layout region 60(2) is 50 percent, and the desired target density of active interconnect features and dummy fill features is also 50 percent, then the density of the dummy fill features 74(1) added is also 50 percent. However, if the density of the active interconnect features 70(1) is less than 50 percent in layout region 60(2), then the density of the dummy fill features 74(2) added is more than 50 percent so that the desired target density of active interconnect features and dummy fill features for the layout region is once again 50 percent. Minimizing overall density variations between layout regions 60(1)–60(n) of the interconnect layer 30 facilitates planarization by chemical mechanical polishing (CMP) during manufacturing of the semiconductor device 80.

When each layout region 60(1)–60(n) has a uniform density, the dummy fill features 74(1)–74(n) thus facilitate uniformity of planarization during manufacturing of the semiconductor device. However, the density does not have to be uniform for every layout region 60(1)–60(n) since each semiconductor device can significantly vary in terms of the density of the active areas in the semiconductor substrate 82, which in turn effects the layout of the active interconnect features in the overlying interconnect layer 30.

Nonetheless, each layout region 60(1)–60(n) preferably has a uniform density. By adding dummy fill features 74(1)–74(n) to obtain a desired density of active interconnect features and dummy fill features, dummy fill features are not unnecessarily added. Unnecessarily adding dummy fill features would undesirably increase the parasitic capacitance of the interconnect layer 30.

Another important feature of the present invention is that positioning of the dummy fill features 74(1)–74(n) is based upon capacitance with adjacent active interconnect features 70(1)–70(n). Likewise, the dummy fill features 74(1)–74(n) are also preferably positioned based upon capacitance with adjacent active interconnect features in an adjacent interconnect layer. In other words, the dummy fill features are selectivity positioned so that the added parasitic capacitance resulting therefrom is minimized.

As readily known by one skilled in the art, there are two types of dummy fill features: grounded and floating. When the grounded configuration is used, all dummy fill features are at a known potential, such as ground. Consequently, the layout algorithm can calculate capacitance after the dummy fill features are positioned. In the floating configuration, the dummy fill features are added to low density areas. However, floating dummy fill features serve as additional coupling paths and effect the total parasitic capacitance of the interconnect layer 30. Determination of the capacitance from the floating configuration is difficult to calculate since there is no path to ground.

The layout algorithm used in the present invention for making a layout for an interconnect layer 30 determines placement of the dummy fill features 74(1)–74(n) for minimizing overall parasitic capacitance as a result of the added dummy fill features. This algorithm places restrictions on the floating dummy fill features 74(1)–74(n) so that they are connected to ground if within a certain range to the active interconnect features 70(1)–70(n).

This range may be the buffer length specified in the algorithm, which is the minimum distance allowed between any active interconnect feature region 70(1)–70(n) and the dummy fill feature region. In this case, the dummy fill 74(1)–74(n) features immediately surrounding the active interconnect features would all be grounded. In general, the range can be optimized to get the best trade-off between the design resources available and the additive component of capacitance introduced due to the coupling effects of the dummy fill features.

Figure 1:
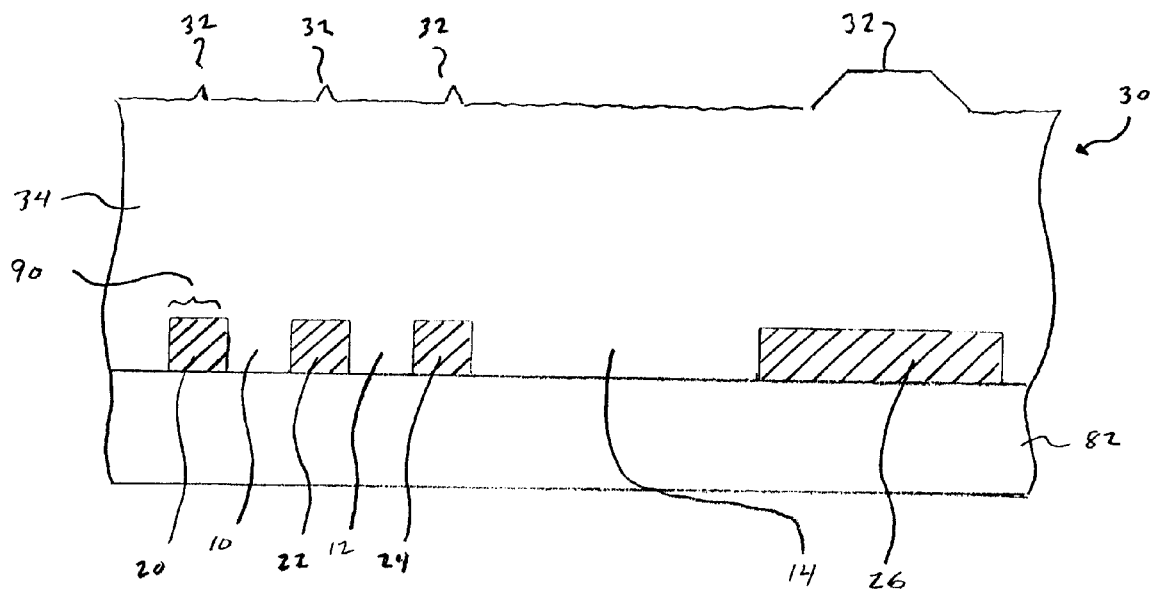
FIG. 1 is a partial cross-sectional view of a semiconductor device illustrating negative bias of the interconnect layer produced by a single-step deposition process before planarization in accordance with the prior art.
Figure 2:
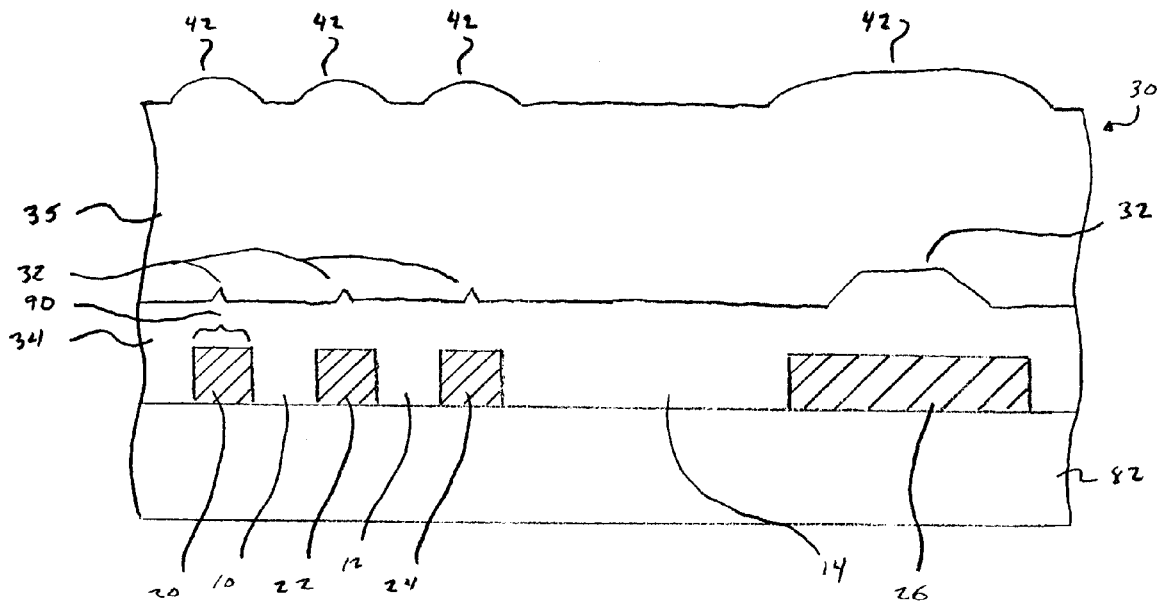
FIG. 2 is a partial cross-sectional view of a semiconductor device illustrating positive bias of the interconnect layer produced by a two-step deposition process before planarization in accordance with the prior art.

Yet another important feature of the method of the present invention includes defining a minimum dummy fill feature lateral dimension 90 based upon a dielectric layer deposition bias for the dielectric material 34 or 35 to be deposited over the interconnect layer 30, as illustrated in FIGS. 1 and 2. The dielectric material is silicon dioxide. After the single step HDP-CVD process illustrated in FIG. 1, the protrusions 32 in the dielectric material overlying a respective active interconnect feature has a negative bias. Negative bias is where the width of the protrusion 32 is less than the width or lateral dimension 90 of the underlying active interconnect feature 20–26.

Referring to FIG. 1, a dummy fill feature is necessary between active interconnect features 24 and 26 to cause another protrusion 32 in the upper surface of the dielectric material 34 to facilitate planarization of the interconnect layer 30. Ideally, the protrusions 32 are positioned in the dielectric material 34 so that dishing during the planarization process is prevented.

With respect to a negative dielectric layer deposition bias, the lateral dimension 90 of any dummy fill feature to be added needs to be a minimum size to cause the desired protrusion. For example, if the negative bias is −1.5 microns, then the lateral dimension of the dummy fill feature needs to be at least twice an absolute value of the negative dielectric layer deposition bias. In other words, the lateral dimension needs to be at least 3 microns to cause a negative bias of −1.5 at the upper surface of the dielectric material.

For a positive dielectric layer deposition bias, as shown in FIG. 2, there is no minimum lateral dimension requirement for the dummy fill feature for causing a protrusion 42 at the upper surface of the dielectric material 35 since the positive bias is always greater than a lateral dimension of a respective dummy fill feature.

Another aspect of the present invention relates to a semiconductor device 80 comprising a semiconductor substrate 82, and at least one interconnect layer 30 overlying the semiconductor substrate. The interconnect layer 30 comprises a plurality of layout regions 60(1)–60(n). substrate comprising a plurality of layout regions 60(1)–60(n).

Each layout region 60(1)–60(n) comprises an active interconnect feature region 70(1)–70(n) and a dummy fill feature region 74(1)–74(n) adjacent thereto for facilitating uniformity of planarization during manufacturing of the semiconductor device. Each of the dummy fill regions 74(1)–74(n) has a different density with respect to other dummy fill regions so that a combined density of the active interconnect feature region 70(1)–70(n) and the dummy fill feature region for a respective layout region 60(1)–60(n) is substantially uniform with respect to a combined density of other layout regions. The interconnect layer 30 comprises metal, and each layout region 60(1)–60(n) has a uniform density.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for making a layout for an interconnect layer of a semiconductor device to facilitate uniformity of planarization during manufacture of the semiconductor device, the method comprising the steps of:

determining an active interconnect feature density for each of a plurality of layout regions of the interconnect layout; and adding dummy fill features to each layout region to obtain a desired density of active interconnect features and dummy fill features to facilitate uniformity of planarization during manufacturing of the semiconductor device, the adding comprising defining a minimum dummy fill feature lateral dimension based upon a dielectric layer deposition bias for a dielectric layer to be deposited over the interconnect layer.

2. A method according to claim 1 further comprising positioning the dummy fill features based upon capacitance with adjacent active interconnect features.

3. A method according to claim 1 further comprising positioning the dummy fill features based upon capacitance with adjacent active interconnect features in an adjacent interconnect layer.

4. A method according to claim 1 wherein the lateral dimension is at least twice as great as an absolute value of a negative dielectric layer deposition bias.

5. A method according to claim 1 wherein the interconnect layer comprises metal.

6. A method according to claim 1 wherein each layout region has a uniform density.

7. A method according to claim 1 wherein the layout regions are contiguous.

8. A method according to claim 1 wherein all the layout regions have a same size.

9. A method for making a semiconductor device comprising the steps of:
   making active regions in a semiconductor substrate;
   making a layout for an interconnect layer comprising the steps of
      determining an active interconnect feature density for each of a plurality of layout regions of the interconnect layout, and
      adding dummy fill features to each layout region to obtain a desired density of active interconnect features and dummy fill features to facilitate uniformity of planarization during manufacturing of the semiconductor device, the adding comprising defining a minimum dummy fill feature lateral dimension based upon a dielectric layer deposition bias for a dielectric layer to be deposited over the interconnect layer; and
   using the layout to make the interconnect layer overlying the semiconductor substrate.

10. A method according to claim 9 further comprising planarizing the interconnect layer.

11. A method according to claim 10 wherein the step of planarizing is performed using chemical mechanical polishing.

12. A method according to claim 9 further comprising positioning the dummy fill features based upon capacitance with adjacent active interconnect features.

13. A method according to claim 9 further comprising positioning the dummy fill features based upon capacitance with adjacent active interconnect features in an adjacent interconnect layer.

14. A method according to claim 9 wherein the lateral dimension is at least twice as great as an absolute value of a negative dielectric layer deposition bias.

15. A method according to claim 9 wherein the interconnect layer comprises metal.

16. A method according to claim 9 wherein each layout region has a uniform density.

17. A method according to claim 9 wherein the layout regions are contiguous.

18. A method according to claim 9 wherein all the layout regions have a same size.

* * * * *